United States Patent [19]
Boone et al.

[11] Patent Number: 5,610,510
[45] Date of Patent: Mar. 11, 1997

[54] HIGH-TEMPERATURE SUPERCONDUCTING THIN FILM NONBOLOMETRIC MICROWAVE DETECTION SYSTEM AND METHOD

[75] Inventors: Bradley G. Boone; Barry E. Grabow, both of Columbia, Md.

[73] Assignee: The Johns Hopkins University, Baltimore, Md.

[21] Appl. No.: 662,907

[22] Filed: Jun. 12, 1996

Related U.S. Application Data

[63] Continuation of Ser. No. 269,176, Jun. 30, 1994, abandoned.

[51] Int. Cl.$^6$ .................................................. G01R 23/04
[52] U.S. Cl. ..................... 324/95; 455/67.5; 250/336.1; 250/336.2
[58] Field of Search .................. 324/95, 248; 250/336.1, 250/336.2; 455/67.5, 337

[56] References Cited

U.S. PATENT DOCUMENTS

| | | | |
|---|---|---|---|
| 4,287,418 | 9/1981 | Divin et al. | 250/336 |
| 5,095,270 | 3/1992 | Ludeke | 324/248 |

OTHER PUBLICATIONS

Grabow, B. E., Boone, B. G., and Sova, R. M., "Modeling and Analysis of High–Temperature Superconducting Thin–Film Detectors," Johns Hopkins APL Tech Dig. 15(1), 18–29 (1994) (month unavailable).

Sova, R. M., Grabow, B. E. and Boone, B. G., "High–Temperature Superconducting Electromagnetic Radiation Detectors," Johns Hopkins, APL Tech. DIG. 14(1), 37–50 (1993). (month unavailable).

Grabow, B. E., Microwave and Optical Detection Using Granular Bi–Sr–Ca–Cu–O Thin Films, Ph.D. dissertation, The Johns Hopkins University (1992). (month unavailable).

Boone, B. G., Sova, R. M., Mooriani, K., Green, W. J., and Grabow, B. E., "Microwave Detection Using Granular Bi–Sr–Ca–Cu–O Thin Films," J. Appl. Phys. 69(4), 2676–2678 (Feb. 1991).

Grabow, B. E., Boone, B. G. and Sova, R. M., "Model of Microwave Response in Granular Bi–Sr–Ca–Cu–O Thin Films," J. Appl. Phys. 74(11), 6985–6987 (Dec. 1993).

Grabow, B. E. and Boone, B. G., "Microwave response measurement and modeling of high temperature superconducting thin film detectors," SPIE, vol. 2159, 156–164 (Sep. 1994).

Primary Examiner—Kenneth A. Wieder
Assistant Examiner—Russell M. Kobert
Attorney, Agent, or Firm—Francis A. Cooch

[57] ABSTRACT

A high-speed, highly sensitive microwave detection system and method, which uses the nonbolometric detection mechanism in a high-temperature superconducting thin film detector. A microwave signal is received by a broadband spiral antenna. The signal is modulated and optionally amplified before being transmitted to the superconducting detector through an impedance matching circuit. The superconducting detector generates an output voltage which is preamplified and then measured using a lock-in amplifier. A computer then records the measured output voltage.

17 Claims, 2 Drawing Sheets

HIGH-TEMPERATURE SUPERCONDUCTING THIN FILM NONBOLOMETRIC MICROWAVE DETECTION SYSTEM AND METHOD

STATEMENT OF GOVERNMENTAL INTEREST

The Government has rights in this invention pursuant to Contract No. N00039-94-C-0001 awarded by the Department of the Navy.

This is a continuation of application(s) Ser. No. 08/269,176 filed on Jun. 30, 1994, now abandoned.

BACKGROUND OF THE INVENTION

The development of high-temperature superconducting (HTSC) thin-film devices for electro-optical and radio-frequency sensors is probably one of the most likely near-term outcomes of recent breakthroughs in the field of superconductivity. Among the many potential devices being considered are passive thin-film devices which can be used as detectors of electromagnetic radiation.

HTSC materials are expected to exhibit excellent performance as quantum (Josephson junction) radiation detectors at extremely high frequencies reaching into the far-infrared band; the performance of these detectors will be limited ultimately by the very high superconducting energy gap found in HTSC materials ($\leq 50$ meV). High sensitivity is also expected for these types of detectors. Fabrication of prescribed (ideal) Josephson junctions is, however, very difficult because the junction size must be on the order of the coherence length, which is extremely short and anisotropic in these materials.

Alternatively, bolometers based on HTSC materials have been proposed because they are relatively easy to fabricate. They operate on the principle that incident radiation of virtually any wavelength will induce a resistive transition from a superconducting/state to a normal state in a thin piece of superconducting film. The substrate must be coupled to a thermal reservoir and have a low heat capacity to yield the best possible response to incident radiation in the shortest possible time. Thus, a tradeoff between response time and sensitivity in bolometric detectors exists that limits their performance relative to ideal quantum detectors.

Granular film (multiple Josephson junction) detectors, on the other hand, may be competitive as electromagnetic detectors. Granular films also appear to display nonbolometric behavior stemming, probably, from multiple weak links. A nonbolometric mechanism may be a better means of making a detector, particularly for microwave frequencies.

SUMMARY OF THE INVENTION

The invention is a high-speed, highly sensitive microwave detection system and method, which uses the nonbolometric detection mechanism in a high-temperature superconducting thin film detector. A microwave signal is received by a broadband spiral antenna and coupled to a parallel plane microstrip transmission line. The signal is modulated to reduce noise and optionally amplified before being transmitted to the superconducting detector through an impedance matching circuit to ensure maximum power transfer. A direct current (dc) bias T network prevents the microwave signal from entering a dc current supply while a capacitor in the transmission line prevents the bias current from entering the modulator. The microwave signal impinging on the superconducting detector causes a change in the resistance thereby generating an output voltage which is measured using a dual-phase voltage lock-in amplifier. A computer can then record the measured output voltage.

DETAILED DESCRIPTION OF THE PREFERRED EMBODIMENT

Figure 1:
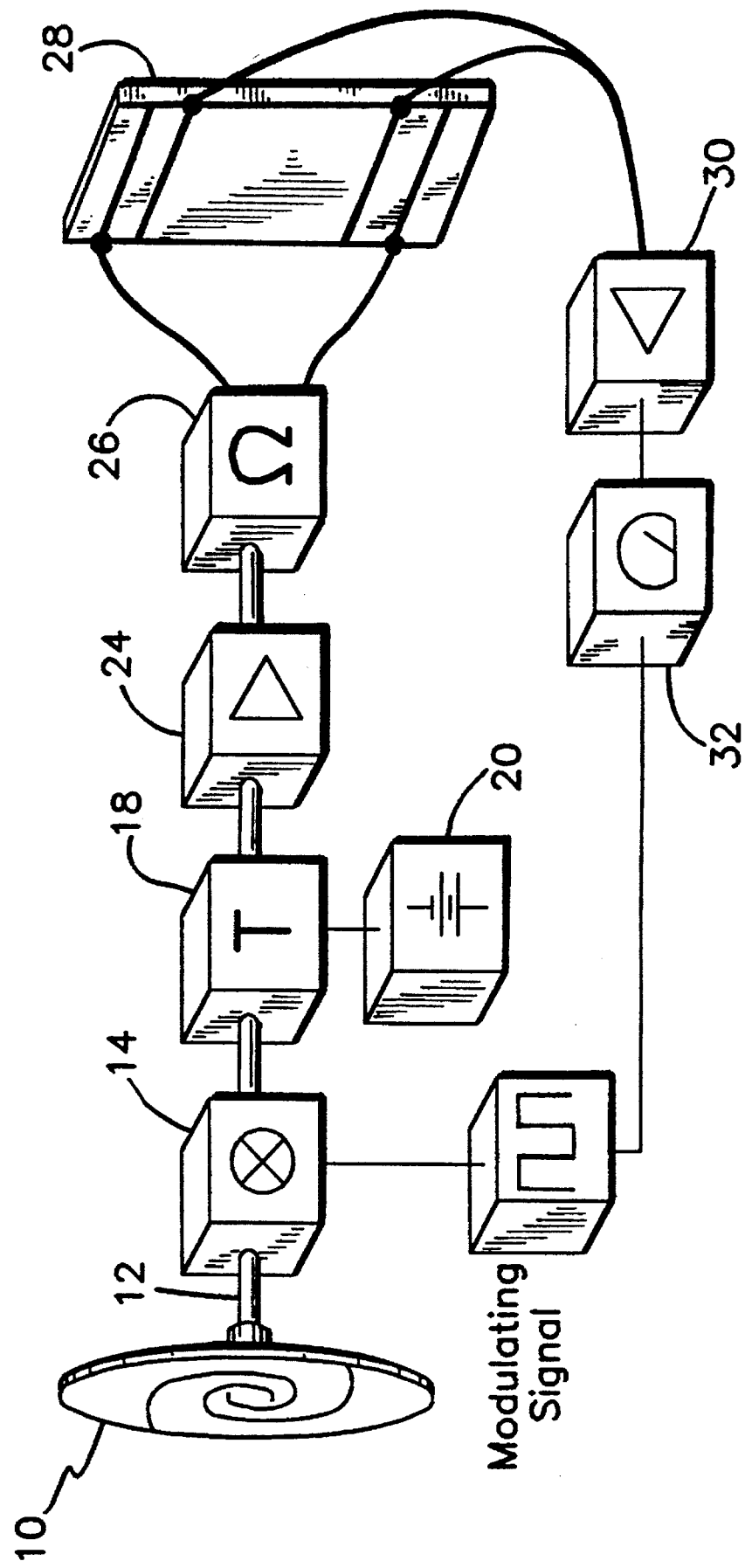
FIG. 1 illustrates a block diagram of the invention.

The invention, shown in FIG. 1 in the block diagram, comprises a broadband microwave (e.g., 2–12 GHz) spiral antenna 10. The antenna couples the microwave signal in free space to a detector transmission line 12. In the embodiment, the transmission line has a 50 $\Omega$ impedance (at 8 GHz) and is fabricated in parallel plane microstrip using a Duroid substrate with a dielectric constant of 2.2 and a thickness of 31 mils.

Figure 2:
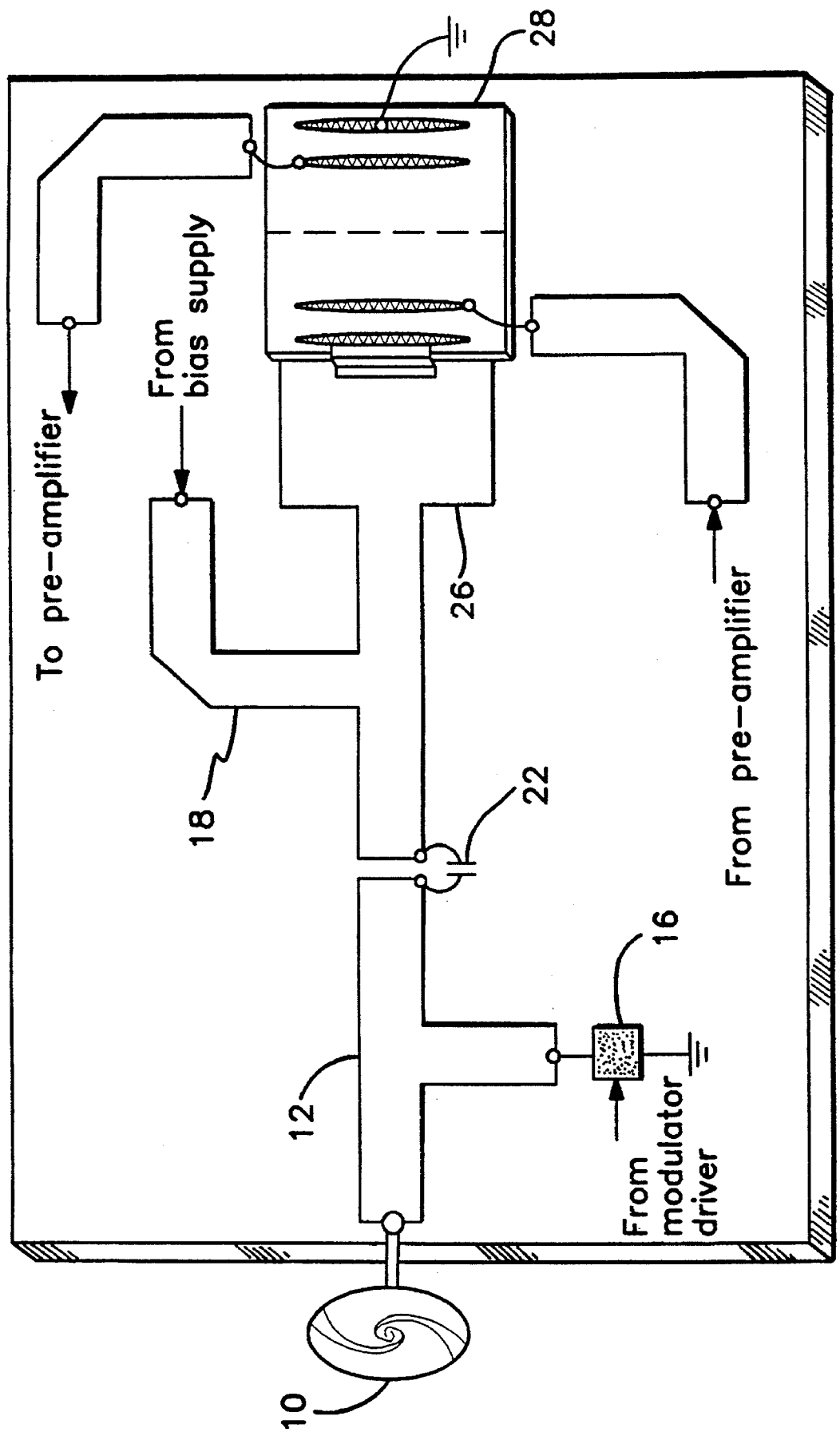
FIG. 2 illustrates a microstrip circuit embodiment of the invention.

A modulator 14, using in this embodiment a JFET transistor 16 (FIG. 2) as the switch, reduces the noise in the incident microwave signal. The source of the JFET transistor is connected to a microstrip stub tuner and the drain is connected to ground providing a microwave short when the transistor is on (high current state at gate), resulting in a high reflection of incident power. When the transistor is off (low current state at gate), the stub appears as an open circuit, there is a low reflection of incident power, and a majority of the incident microwave signal is transmitted to the detector.

A direct current (dc) bias T network 18 prevents the microwave signal from entering a dc current supply 20. The bias circuit is designed so that all nodes where dc current is applied or dc voltage is measured appear as open circuits to the microwave signal. This is done using open circuit stub tuners at all dc bias and voltage measurement nodes A capacitor 22 (e.g., 10 pF) (FIG. 2) is required in the transmission line to prevent the bias current from entering the modulator transistor.

An optional microwave signal amplifier 24 can be inserted in the system, if desired, allowing amplification of the microwave signal. The signal is then transmitted to an impedance matching circuit 26 which matches transmission line impedance (50 $\Omega$ in this embodiment) to the superconducting detector 28 to ensure maximum power transfer to the detector.

The superconducting detector consists of a high-temperature superconducting thin film operating in a nonbolometric mode. The detector generates an output voltage when a microwave signal impinges thereon. The generated voltage is received by a low noise voltage preamplifier 30 and is then transmitted to a dual-phase voltage lock-in amplifier 32, where the voltage is measured. The measured voltage can then be recorded in an attached data processing system (computer) (not shown).

In operation, incident microwave radiation received by the spiral antenna is modulated and amplified before impinging on the superconducting detector. The nonbolometric detection mechanism of the high-temperature superconducting thin film is utilized to generate a modulated output voltage, which is then measured using lock-in detection at the modulation frequency. The demodulated output signal data is then recorded on a computer.

The microwave detection system of the invention has applications in broadband power detection, broadcast communication and satellite communications systems.

We claim:

1. A microwave signal detection system comprising:
   an antenna means for coupling the microwave signal in free space to a transmission line;
   a means for reducing noise in the microwave signal;
   a capacitor means for preventing a bias current from entering the reducing noise means;
   a means for preventing the microwave signal from entering a bias current supply;
   a means for matching the impedance of the transmission line to a detector;
   a granular, high-temperature superconducting thin film for generating an output voltage representative of the microwave signal; and
   a means for measuring the output voltage to detect the microwave signal.

2. The microwave signal detection system as recited in claim 1, the reducing noise means comprising a modulating means.

3. The microwave signal detection system as recited in claim 2, wherein the modulating means comprises a JFET transistor.

4. The microwave signal detection system as recited in claim 1, the measuring means comprising a voltage lock-in amplifier.

5. The microwave signal detection system as recited in claim 4, the measuring means further comprising a voltage preamplifier.

6. The microwave signal detection system as recited in claim 1, further comprising a means for amplifying the microwave signal before the microwave signal is transmitted to the granular high-temperature superconducting thin film.

7. The microwave signal detection system as recited in claim 1, further comprising a data processing means for recording the output voltage received from the measuring means.

8. The microwave signal detection system as recited in claim 1, wherein the antenna means comprises a broadband spiral antenna.

9. The microwave signal detection system as recited in claim 1, wherein the transmission line comprises a parallel plane microstrip.

10. The microwave signal detection system as recited in claim 1, wherein the preventing means comprises a bias current T network.

11. The microwave signal detection system as recited in claim 1, wherein the high-temperature superconducting thin film uses a nonbolometric detection mechanism.

12. A microwave signal detection system comprising:
    a broadband spiral antenna for receiving the microwave signal from free space;
    a parallel plane microstrip transmission line for receiving the microwave signal from the antenna;
    a JFET transistor for modulating the microwave signal;
    a capacitor for preventing a bias current from entering the JFET transistor;
    a bias current T network for preventing the microwave signal from entering a bias current supply;
    an amplifier for amplifying the microwave signal;
    a means for matching the impedance of the transmission line to a detector;
    a granular, high-temperature superconducting thin film using a nonbolometric detection mechanism for generating an output voltage representative of the microwave signal;
    a preamplifier for amplifying the output voltage; and
    a lock-in amplifier for measuring the output voltage.

13. A method for detecting a microwave signal comprising the steps of:
    coupling the microwave signal in free space to a transmission line in a microwave detection system;
    modulating the microwave signal using a modulating means;
    preventing a bias current from entering the modulating means;
    preventing the microwave signal from entering a bias current supply;
    matching the impedance of the transmission line to a detector;
    impinging the microwave signal on a granular, high-temperature superconducting thin film to generate an output voltage representative of the microwave signal; and
    measuring the output voltage to detect the microwave signal.

14. The method for detecting a microwave signal as recited in claim 13, the measuring step further comprising the step of amplifying the output voltage.

15. The method for detecting a microwave signal as recited in claim 13, further comprising the step of amplifying the microwave signal before the microwave signal is transmitted to the detector for generating the output voltage.

16. The method for detecting a microwave signal as recited in claim 13, further comprising, after the measuring step, the step of recording the output voltage.

17. The method for detecting a microwave signal as recited in claim 13, wherein the high-temperature superconducting thin film uses a nonbolometric detection mechanism.

* * * * *